(12) United States Patent
Peluso

(10) Patent No.: US 9,484,944 B2
(45) Date of Patent: Nov. 1, 2016

(54) CURRENT COUNTING ANALOG-TO-DIGITAL CONVERTER FOR LOAD CURRENT SENSING INCLUDING DYNAMICALLY BIASED COMPARATOR

(71) Applicant: QUALCOMM Incorporated, San Diego, CA (US)

(72) Inventor: Vincenzo F Peluso, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 181 days.

(21) Appl. No.: 14/329,661

(22) Filed: Jul. 11, 2014

(65) Prior Publication Data

US 2016/0013804 A1 Jan. 14, 2016

(51) Int. Cl.
  *G01R 19/165* (2006.01)
  *H03M 1/34* (2006.01)
  *H03M 1/60* (2006.01)
  *H03K 5/24* (2006.01)

(52) U.S. Cl.
  CPC .......... *H03M 1/34* (2013.01); *G01R 19/16566* (2013.01); *H03K 5/2481* (2013.01); *H03M 1/60* (2013.01)

(58) Field of Classification Search
  CPC .................. G01R 19/16566; G01R 19/16576; G01R 23/09; G01R 11/16; G01R 19/165; G01R 19/10; H03M 1/34; H03M 1/60; H03K 5/2481; H03K 17/962; G01D 5/24
  USPC .................... 341/164; 324/650–690
  See application file for complete search history.

(56) References Cited

U.S. PATENT DOCUMENTS

| 3,968,447 A | 7/1976 | Baylac et al. |
| 6,466,036 B1 * | 10/2002 | Philipp ............ G01D 5/24 324/658 |

(Continued)

FOREIGN PATENT DOCUMENTS

EP 1619509 A1 1/2006

OTHER PUBLICATIONS

Kwon S., et al., "A 1.2V, 3.5 µW, 20MS/s, 8-bit comparator with dynamic-biasing preamplifier," IEEE International Symposium on Circuits and Systems, 2006, pp. 4767-4770.

(Continued)

*Primary Examiner* — Son Le
*Assistant Examiner* — Brent J Andrews
(74) *Attorney, Agent, or Firm* — Haynes and Boone, LLP

(57) ABSTRACT

In one embodiment, a circuit comprises first and second capacitors configured to receive a sense current in first and second modes, respectively. A comparator is coupled to the first capacitor to compare a voltage of the first capacitor to a reference voltage and generate a count signal in response to the voltage of the first capacitor reaching the reference voltage in the first mode. The comparator is coupled to the second capacitor to compare a voltage of the second capacitor to the reference voltage and generate the count signal in response to the voltage of the second capacitor reaching the reference voltage in the second mode. A reset circuit discharges the first capacitor in the second mode and the second capacitor in the first mode in response to the count signal. A counter increments a count of a number of occurrences of the count signal.

15 Claims, 9 Drawing Sheets

(56) References Cited

U.S. PATENT DOCUMENTS

| | | | |
|---|---|---|---|
| 7,236,015 B2 | 6/2007 | Eberlein | |
| 7,507,947 B2 | 3/2009 | Bamji et al. | |
| 8,237,449 B2 | 8/2012 | Rallabandi et al. | |
| 2005/0275435 A1 | 12/2005 | Kim et al. | |
| 2009/0212984 A1* | 8/2009 | Baker | G11C 11/5642 341/142 |
| 2013/0175861 A1 | 7/2013 | Wynne | |
| 2014/0002411 A1 | 1/2014 | Huang et al. | |

OTHER PUBLICATIONS

International Search Report and Written Opinion—PCT/US2015/039712—ISA/EPO—Jan. 7, 2016.

* cited by examiner

CURRENT COUNTING ANALOG-TO-DIGITAL CONVERTER FOR LOAD CURRENT SENSING INCLUDING DYNAMICALLY BIASED COMPARATOR

BACKGROUND

The disclosure relates to current counting systems, and in particular, to current counting analog-to-digital converter for load current sensing including dynamically biased comparator.

Unless otherwise indicated herein, the approaches described in this section are not admitted to be prior art by inclusion in this section.

As part of a solution to measure load current of a low-drop out regulator (LDO), for example, a measured replica current is converted to a digital representation. This could be done with e.g. a Sigma-Delta Analog-to-Digital Converter (ADC) that is shared between all "clients". In the particular case of load current measurement, it is desirable to filter the current measurement with a large time constant, e.g. 1 millisecond or average it over a long time period, e.g. 1 millisecond. In order to realize this large time constant, capacitors and resistors are needed of such large values that the capacitors would need to be off chip and the resistors would need a very large in chip area. This makes the RC filtering approach cost prohibitive (e.g., chip area cost, board area cost, component cost, and pin cost).

SUMMARY

The present disclosure relates to current counting analog-to-digital converter for load current sensing and converters including dynamically biased comparator.

In one embodiment, a circuit comprises a first capacitor configured to receive a sense current in a first mode. A second capacitor is configured to receive a sense current in a second mode. A comparator is coupled to the first capacitor to compare a voltage of the first capacitor to a reference voltage and generate a count signal in response to the voltage of the first capacitor reaching the reference voltage in the first mode. The comparator is coupled to the second capacitor to compare a voltage of the second capacitor to the reference voltage and generate the count signal in response to the voltage of the second capacitor reaching the reference voltage in the second mode. A reset circuit discharges the first capacitor in the second mode and discharges the second capacitor in the first mode in response to the count signal. A counter increments a count of a number of occurrences of the count signal.

In one embodiment, the circuit further comprises a switch circuit to couple the first capacitor to the comparator in the first mode and couple the second capacitor to the comparator in the second mode.

In one embodiment, the reset circuit comprises a first switch coupled in parallel to the first capacitor and a second switch coupled in parallel to the second capacitor.

In one embodiment, the comparator comprises a main comparator having an input coupled to the first capacitor and to the second capacitor. The main comparator compares the voltage on the input to the reference voltage and generates the count signal in response to the voltage on the input reaching the reference voltage. The comparator further comprises an auxiliary comparator that enables the main comparator when the input to the main comparator is within a threshold of the reference voltage.

In one embodiment, the comparator comprise a main comparator having an input coupled to the first capacitor and to the second capacitor. The main comparator compares the voltage on the input to the reference voltage and generates the count signal in response to the voltage on the input reaching the reference voltage. An auxiliary comparator includes an input coupled to the first capacitor and to the second capacitor and including an output to provide an enable signal to the main comparator in response to a comparison of the voltage on the input to a trigger voltage that is less than the reference voltage.

In one embodiment, the comparator comprises a main comparator having an input coupled to the first capacitor and to the second capacitor. The main comparator compares the voltage on the input to the reference voltage and generates the count signal in response to the voltage on the input reaching the reference voltage. The main comparator includes a differential input pair and a switch to selectively ground the differential input pair. The comparator further comprises an auxiliary comparator that enables the switch of the main comparator in response to the input to the main comparator being within a threshold of the reference voltage.

In one embodiment, the main comparator comprises one or more preamplifiers to increase DC bias of the differential input pair of the main comparator or to amplify the input signal.

In one embodiment, the auxiliary comparator comprises a differential input pair.

In another embodiment, a circuit comprises first means for integrating charge received from a current source in a first mode; second means for integrating charge received from the current source in a second mode; means for comparing a voltage of the first means for integrating charge to a reference voltage and generating a count signal in response to the voltage of the first means for integrating charge reaching the reference voltage in the first mode and for comparing a voltage of the second means for integrating charge to the reference voltage and generating the count signal in response to the voltage of the second means for integrating charge reaching the reference voltage in the second mode; means for counting a number of occurrences of the count signal; first means for discharging the first means for integrating charge in response to the count signal in the second mode; and second means for discharging the second means for integrating charge in response to the count signal in the first mode.

In one embodiment, the means for comparing comprises main means for comparing a voltage on an input thereof that is coupled to the first means for integrating charge and to the second means for integrating charge to the reference voltage and generating the count signal in response to the voltage on the input reaching the reference voltage. The means for comparing also comprises auxiliary means for comparing the input to the main means to the reference voltage, and if the comparison is within a threshold of the reference voltage, enabling the main means for comparing.

In one embodiment, the means for comparing comprises main means for comparing a voltage on an input thereof that is coupled to the first means for integrating charge and to the second means for integrating charge to the reference voltage and generating the count signal in response to the voltage on the input reaching the reference voltage. The main means for comparing includes a differential input pair and a switch to selectively ground the differential input pair. The means for comparing further comprises auxiliary means for comparing the input to the main means to the reference voltage, and if the comparison is within a threshold of the reference voltage, enabling the switch of the main means for comparing.

In one embodiment, the main means for comparing comprises means for increasing DC bias of the differential input pair of the main means for comparing.

In one embodiment, the auxiliary means for comparing comprises a differential input pair.

In one embodiment, a method comprises storing charge received from a current source in a first capacitor in a first mode; storing charge received from a current source in a second capacitor in a second mode; discharging the first capacitor in the second mode; discharging the second capacitor in the first mode; comparing a voltage of the first capacitor to a reference voltage and generating a count signal in response to the voltage of the first capacitor reaching the reference voltage in the first mode; comparing a voltage of the second capacitor to the reference voltage and generating the count signal in response to the voltage of the second reaching the reference voltage in the second mode; counting a number of occurrences of the count signal; and switching between the first and second modes in response to the count signal.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
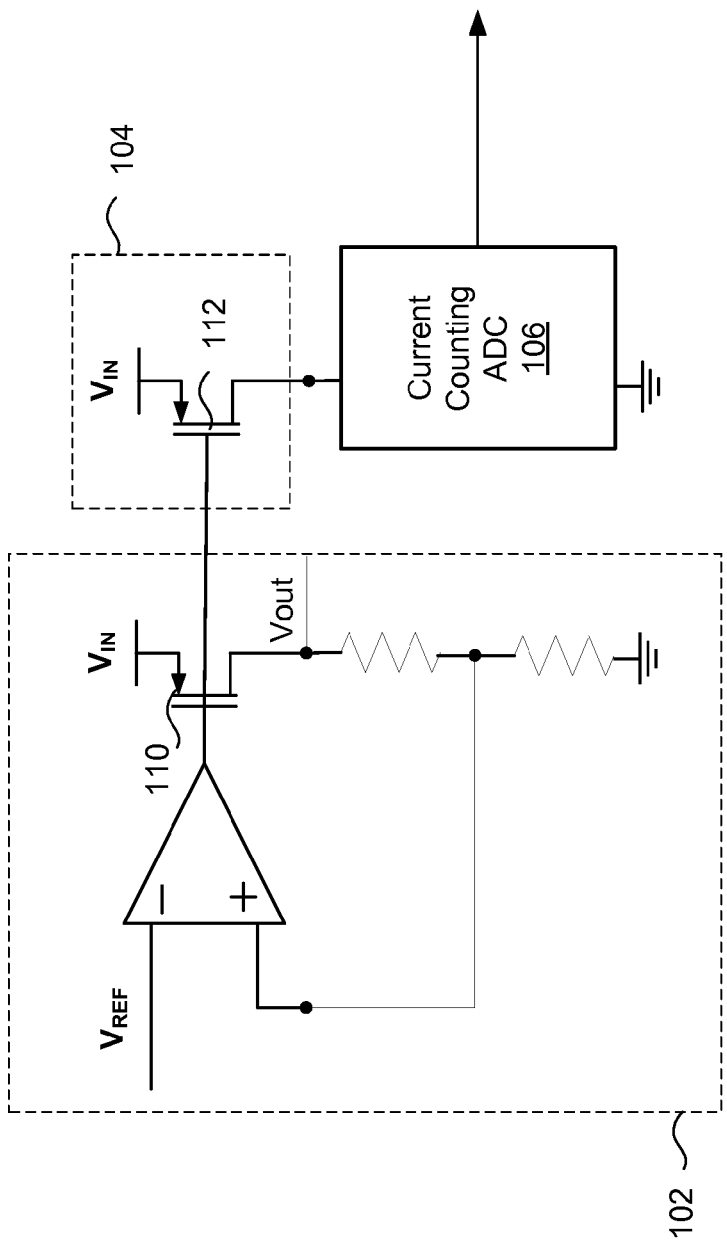
FIG. 1 illustrates a block diagram of a current count system according to an embodiment.

FIG. 1 illustrates a block diagram of a current count system 100 according to an embodiment. Current count system 100 can be used in a power management integrated circuit (PMIC). Current count system 100 comprises a circuit-under-test 102, a current source 104, and a current counting analog-to-digital converter (ADC) 106. In this example, circuit-under-test 102 is a low-drop out regulator (LDO). Although circuit-under-test 102 is described as an LDO, circuit-under-test 102 can be switches, bulk head switches, or Battery Field-Effect Transistor (BATFET).

Current source 104 senses a current of circuit-under-test 102 and provides a replica current to current counting ADC 106. In this example, current source 104 comprises a replica FET 112 that generates a replica current of a pass FET 110 of circuit-under-test 102. Current counting ADC 106 performs an analog to digital conversion of a measured current signal input.

The current counting systems described herein can be used for long time averaging of the current input signal.

The current counting systems described herein can avoid the need of a temperature independent resistor, which may not be available in a Silicon process.

Figure 2:
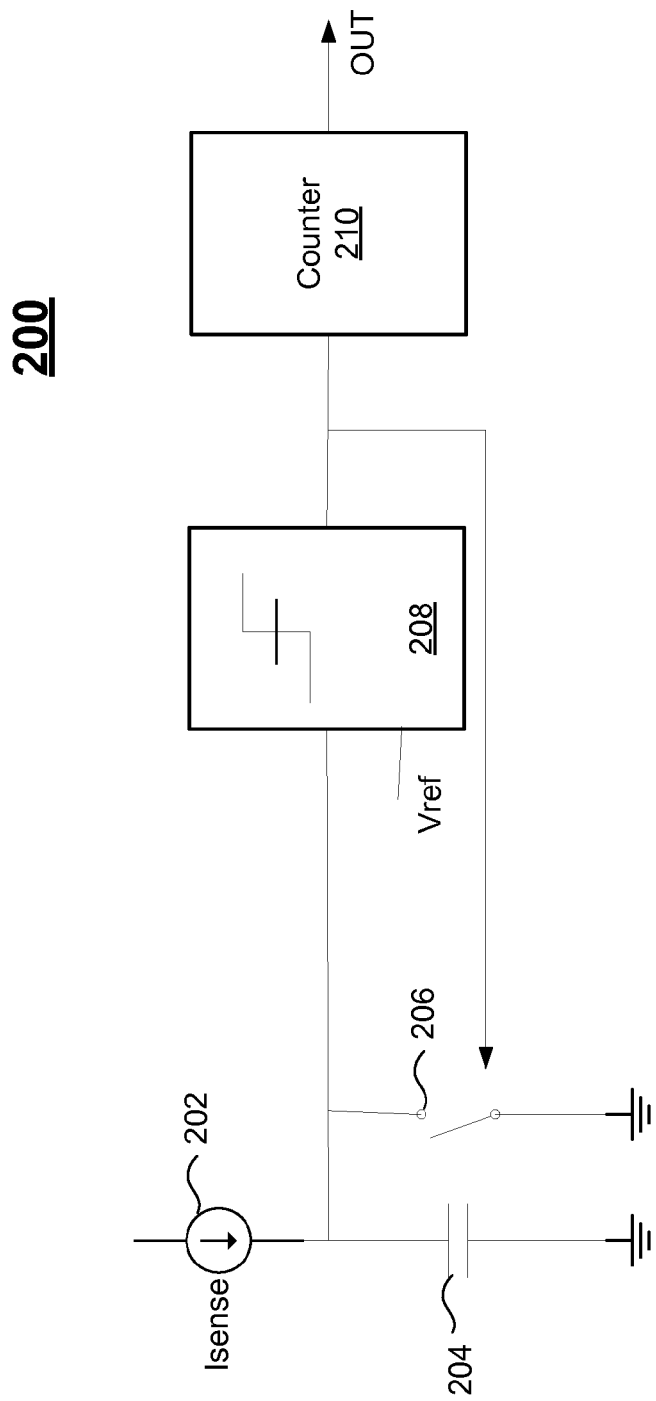
FIG. 2 is a current count system according to an embodiment.

FIG. 2 is a current count system 200 according to an embodiment. Current count system 200 comprises a current source 202, a capacitor 204, a switch 206, a comparator 208, and a counter 210. Capacitor 204 integrates a sense current Isense provided by current source 202. Comparator 208 triggers in response to the voltage across capacitor 204 exceeding a reference voltage Vref. The reference voltage Vref can be set to a value based on a practical size of the capacitor for the implementation, such as 1 Volt. When comparator 208 triggers, comparator 208 resets capacitor 204 by closing switch 204 to short capacitor 204 to ground for discharging capacitor 204. Counter 210 counts the number of times that comparator 208 triggers during a time period (e.g., 1 millisecond). Counter 210 can be viewed as counting the number of times that capacitor 204 is reset. System 200 loses charge (Isense) to ground when switch 206 is closed to discharge capacitor 204 to ground. This charge loss causes error. Thus, the current determination has an inaccuracy from this error.

Figure 3:
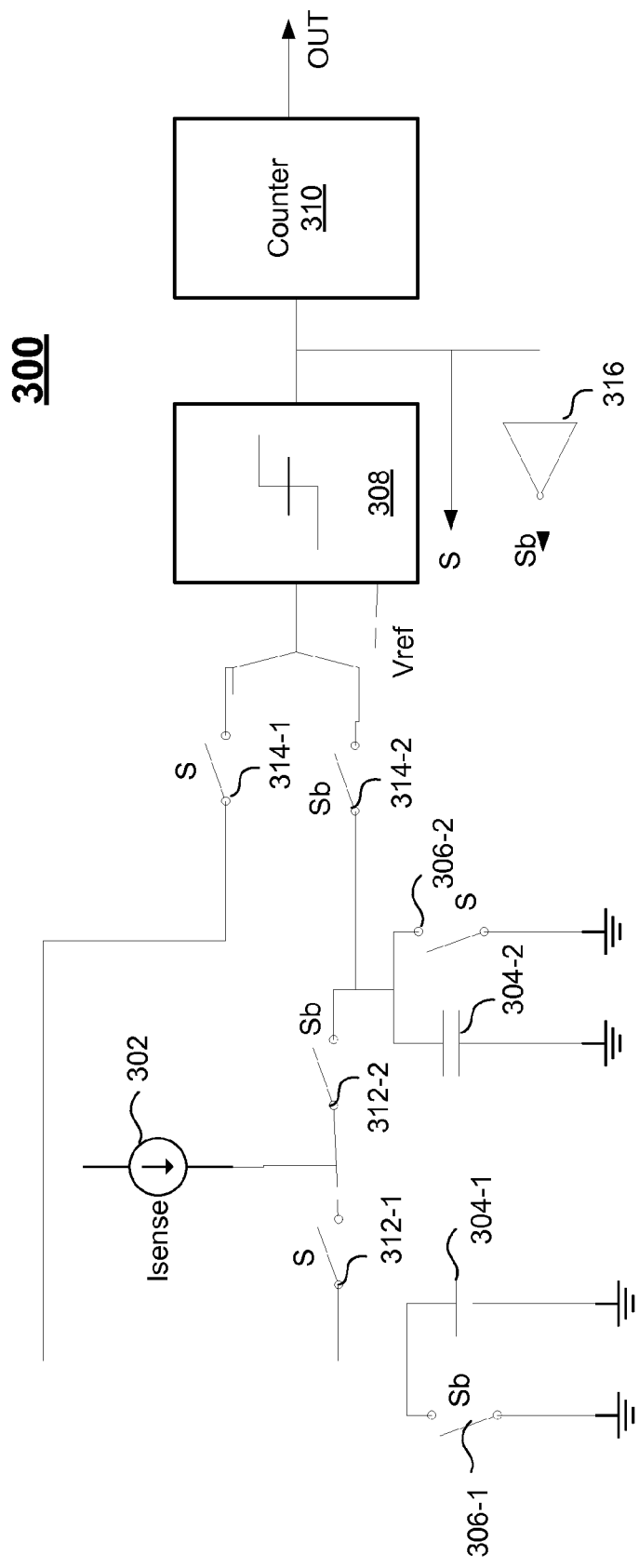
FIG. 3 is a current count system according to another embodiment.

FIG. 3 is a current count system 300 according to an embodiment. Current count system 300 comprises a current source 302, a plurality of capacitors 304, a plurality of switches 306, a comparator 308, a counter 310, a plurality of switches 312, a plurality of switches 314 and an inverter 316. System 300 includes two capacitors 304-1 and 304-2 that function as capacitor integrators of a sense current Isense provided by current source 302. A switch system of switches 312 alternately couple current course 302 to capacitors 304-1 and 304-2 and of switches 314 couple capacitors 304 to comparator 306 so that the capacitors 304 alternately integrate the sense current Isense until one of the capacitors 304 reaches the reference voltage Vref. At such time, counter 310 increases the count, the capacitor 304 is reset, and the other capacitor 304 is switched in to integrate the sense current Isense. The switch system couples capacitor 304-1 to current 302 by switch 312-1 and to comparator 308 by switch 314-1 in response to a switch signal S from comparator 308. The switch system discharges capacitor 304-2 by grounding or coupling capacitor 304-2 to ground through switch 304-2 in response to switch signal S. The switch system couples capacitor 304-2 to current 302 by switch 312-2 and to comparator 308 by switch 314-2 in response to a switch signal Sb from comparator 308 through inverter 316. The switch system discharges capacitor 304-1 by grounding or coupling capacitor 304-1 to ground through switch 306-1 in response to switch signal Sb. The switch signal S and the switch signal Sb are inverted so that one capacitor 304 is charging while the other is discharging. In this embodiment, no sense current Isense is lost to ground during the discharge of the capacitors because one capacitor is always integrating the sense current Isense.

The reference Vref can be provided by a bandgap voltage reference. The switch system and capacitors 304 do not use an operational amplifier thereby use a small area of an integrated circuit.

Figure 4:
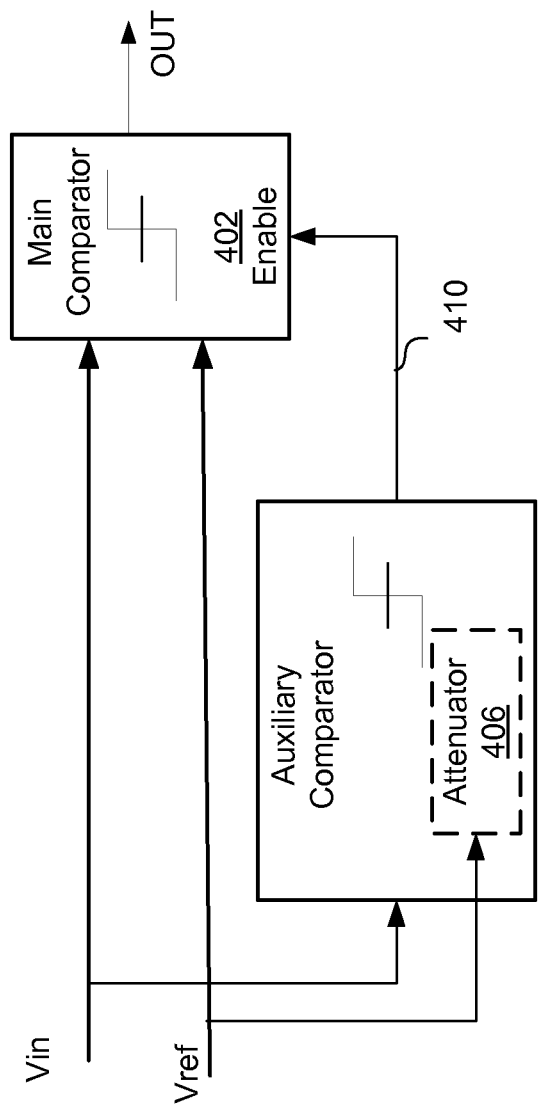
FIG. 4 illustrates a block diagram of a comparator system according to an embodiment.

FIG. 4 illustrates a block diagram of a comparator system 400 according to an embodiment. Comparator system 400 can be used for comparators 208, 308 in the systems of FIGS. 2-3. Comparator system 400 comprises a main comparator 402 and an auxiliary comparator 404. The speed of the comparators herein can be increased by increasing the bias current. In some embodiments, rather than keeping main comparator 402 always on and thereby always drawing a large quiescent current, main comparator 402 uses dynamic biasing.

Main comparator 402 uses dynamic biasing to remain off until the input voltage Vin is close to the reference voltage Vref (in this example, 90%). Auxiliary comparator 404 continuously monitors and compares the input voltage Vin to the reference voltage Vref. When the input voltage Vin is within a threshold (in this example, 90%) of the reference voltage Vref, auxiliary comparator 404 turns on the bias of main comparator 402 using the comparator enable signal 410. In some embodiments, auxiliary comparator 404 comprises an optional attenuator 406 (such as a voltage divider) that generates a second reference voltage (or trigger voltage) from the reference voltage Vref and that is lower than the reference voltage Vref for the comparison to the input voltage Vin. In some embodiments, the function of attenuator 406 is done by an offset in auxiliary comparator 404, or an unbalanced input pair, such as described below in conjunction with FIG. 6.

Auxiliary comparator 404 detects when the rising voltage signal of the input voltage Vin gets close to the reference voltage Vref and generates the comparator enable signal 410 for main comparator 402 to detect when the input voltage Vin reaches the reference voltage Vref. In this example, when comparator system 400 is used as comparator 310 in the current count system 300, main comparator 402 triggers when the voltage on one of the capacitors 304 reaches the reference voltage Vref.

Figure 5:
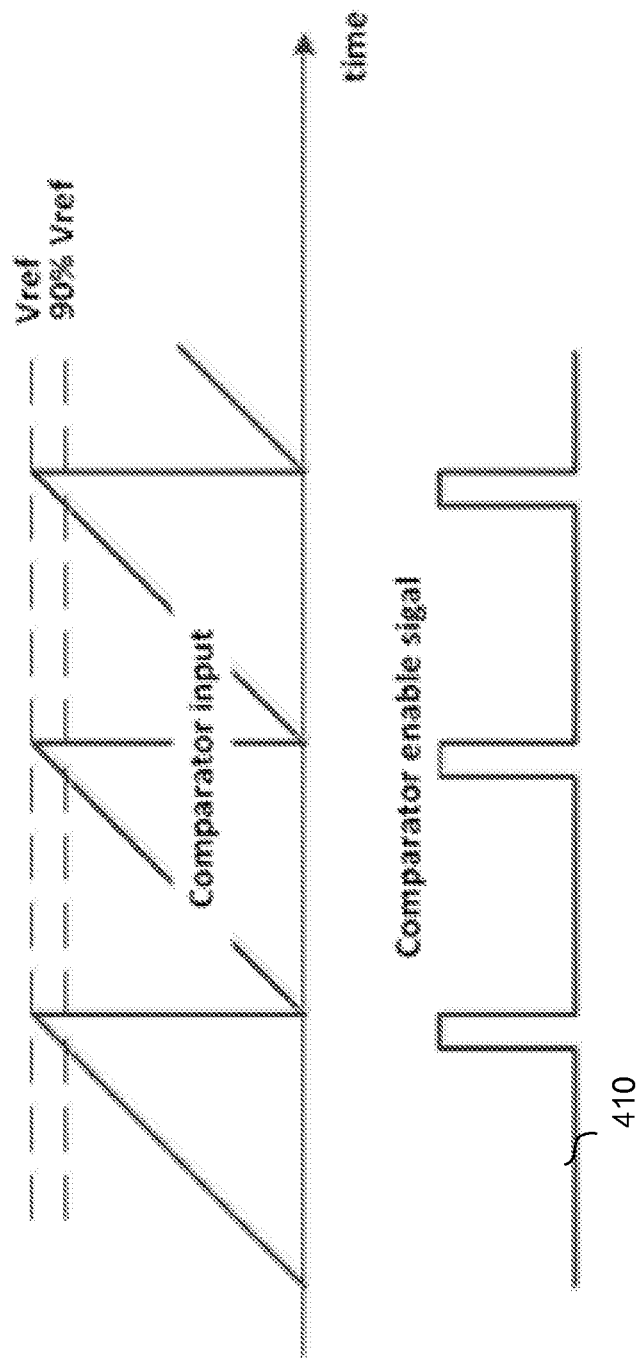
FIG. 5 illustrates a timing diagram of comparator inputs and outputs according to an embodiment.

FIG. 5 illustrates the timing diagram of comparator inputs and generates the comparator enable signal 410 provided by auxiliary comparator 404. The input of comparator 400 rises until comparator 400 triggers to reset capacitor 304. Until the capacitor 304 is reset, the input voltage is continuously rising. Thus, the turn on of the bias in comparator 402 can be delayed until the input voltage is close to the reference voltage (e.g., at 90% of the reference voltage). A comparator enable signal 410 is generated by auxiliary comparator 404 for such control.

Figure 6:
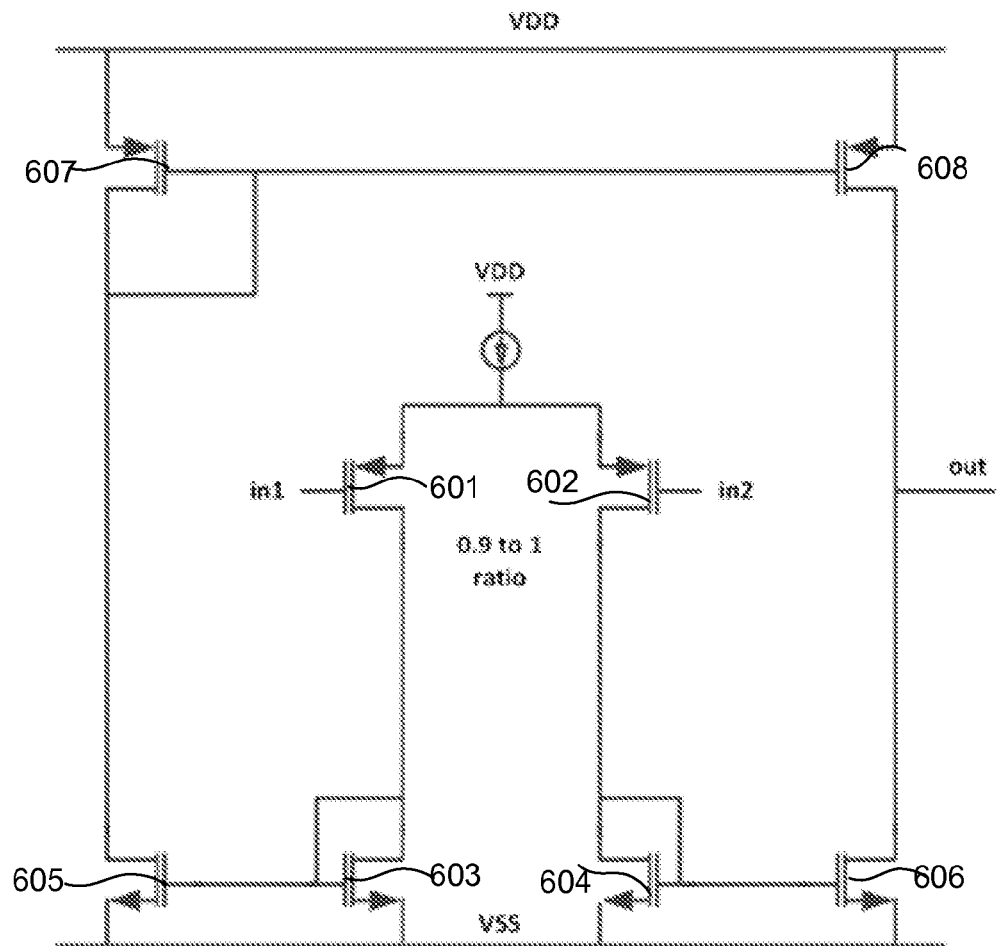
FIG. 6 illustrates a block diagram of an auxiliary comparator according to an embodiment.

FIG. 6 illustrates a block diagram of an auxiliary comparator 600 that is a differential to single ended comparator, which is one example of auxiliary comparator 404. An input pair formed of transistors 601 and 602 has a 0.9 to 1 ratio to provide the 0.9*Vref comparison. In another example, auxiliary comparator 600 has an input pair that is balanced, and has an offset (such as a built in offset) that provides a trigger below the reference voltage Vref, such as 0.9*Vref. Transistors 603 and 604 provide a load on the input pair of transistors 601 and 602. Transistors 605, 606, 607 and 608 prove a single ended output OUT as the comparator enable signal 410 (FIG. 4).

Figure 7:
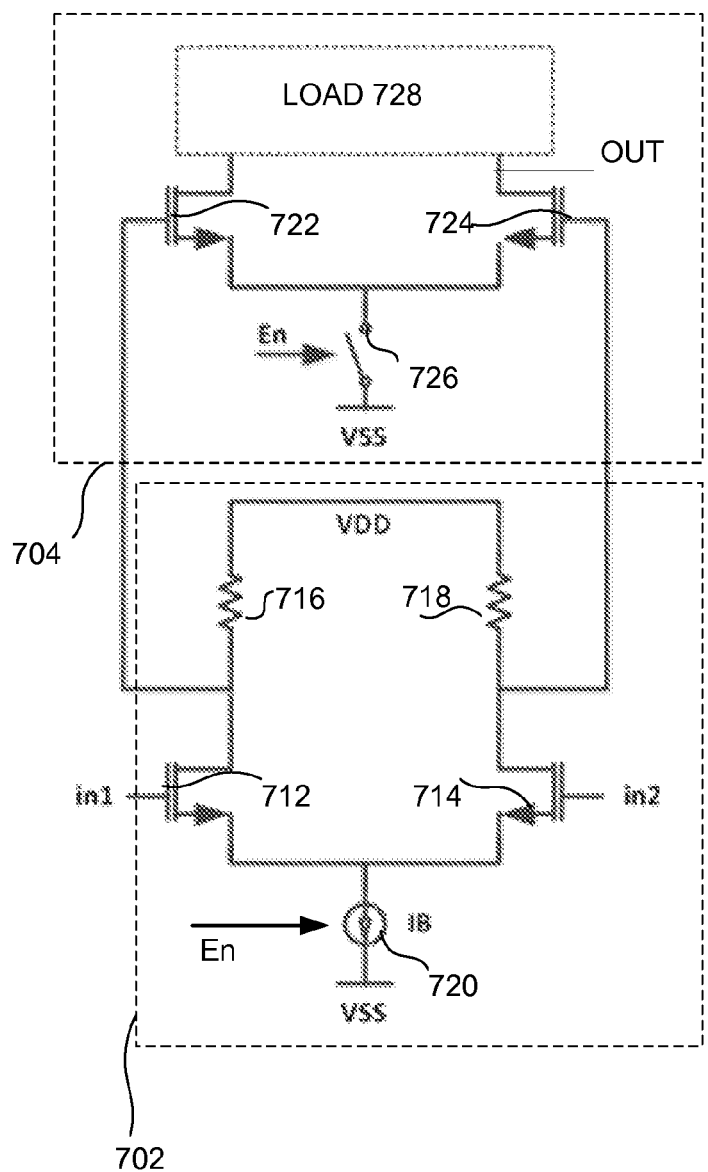
FIG. 7 illustrates a block diagram of a comparator according to an embodiment.

FIG. 7 illustrates a block diagram of comparator 700 according to an embodiment. Comparator 700 comprises a preamplifier stage 702 and a comparator stage 704. The speed of comparator 700 for flipping between the two legs can be increased by increasing the speed in the current mirrors and in the charging/discharging output node. In some embodiments, the speed is increased by increasing the absolute current levels of comparator 700. Preamplifier stage 702 includes a switch 726 for biasing the differential input pair instead of a current source, to generate a large differential current.

The speed of comparator 700 can be increased by increasing the imbalance between the currents in the differential input pair. Ideally all the current goes through one leg of the pair, and none goes through the other leg of the pair. Using preamplifier stage 702 amplifies the input voltage difference so that a larger current imbalance is generated in comparator stage 704. Preamplifier stage 702 can set the DC bias of the differential input pair of comparator stage 704 by setting the DC output level of preamplifier stage 702.

Preamplifier stage 702 amplifies the signal to increase the imbalance of the signal in comparator stage 704. The increase in the imbalance increases the flipping of the comparator. Preamplifier 702 comprises a differential input pair formed of transistors 712 and 714 and loads 716 and 718 represented as resistors. A tail current source 720 provides a bias current IB. Although preamplifier stage 702 is shown as include only one preamplifier, preamplifier stage 702 can include one or more preamplifiers.

Comparator stage 704 comprises a differential input pair formed of transistors 722 and 724, a switch 726 that couples the source of the transistors 722 and 724 to ground, and a load 728 for the differential input pair formed of transistors 722 and 724.

Preamplifier stage 702 increases the differential voltage difference on the differential input pair formed of transistors 722 and 724 of comparator stage 704 to cause a larger imbalance of the current and lead to a faster flipping of comparator stage 704.

Switch 726 provides for dynamic biasing of comparator stage 704 by coupling the input pair of ground. Increasing the gate-source voltage (Vgs) on the input transistors to the comparator increases the differential current in the differential pair to maximize the Vgs of transistors 722 and 724 to effectively create the largest bias current. The grounding of the source can be viewed as biasing the input pair in a "pseudo differential" manner.

The DC gate bias level of transistors 722 and 724 can be set at a level to increase Vgs on transistors 722 and 724 by setting the bias current IB of current source 720 and the resistance (R) of loads 716 and 718. The DC bias is the supply voltage VDD-IB*R. Increasing the DC gate bias increases the current in the differential pair of comparator stage 704.

Although tail current source 720 is shown as a fixed current source, the switched bias techniques described for comparator stage 704 can be applied to current source 720 and the differential input pair formed of transistors 712 and 714 of preamplifier stage 702. Preamplifier 702 can have dynamic switch biasing. In one embodiment, bias current of preamplifier 702 can be switched between a zero current (e.g., an off state) and a full current state (e.g., the bias current IB, the same bias current that the preamplifier would be used if dynamic switch biasing is not used). It is noted that comparator stage 704 in contrast is biased by the Vgs of transistors 722 and 724.

Figure 8:
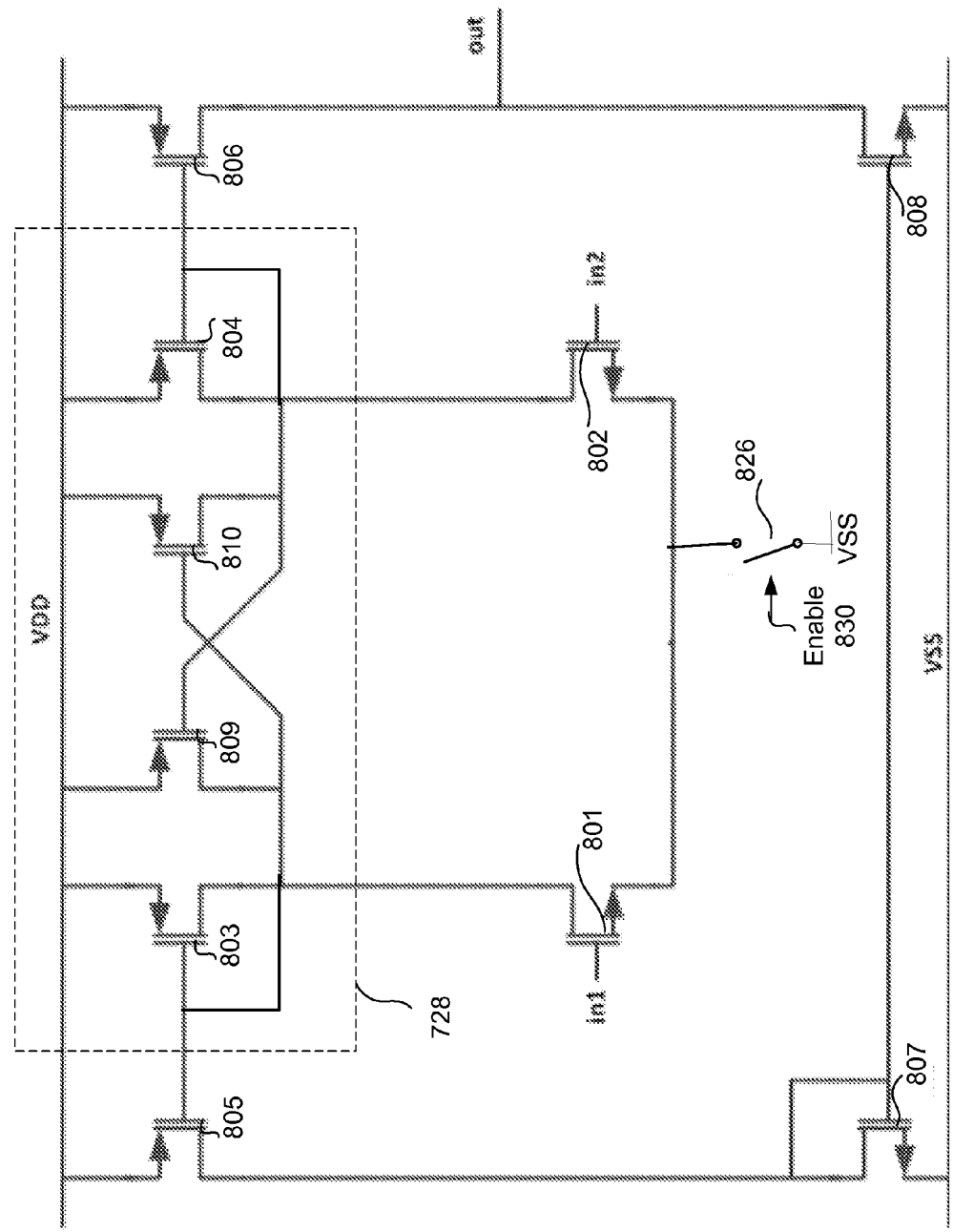
FIG. 8 illustrates a block diagram of a comparator according to another embodiment.

FIG. 8 illustrates a block diagram of a comparator 800 that is a differential to single ended comparator, which is one example of comparator stage 704. An input pair formed of transistors 801 and 802 can receive the reference voltage Vref and the input voltage in an implementation such as in FIG. 4, or the amplified outputs from preamplifier stage 702 of FIG. 7. Transistors 803 and 804 provide a load on the input pair of transistors 801 and 802. Transistors 805, 806, 807 and 808 prove a single ended output OUT. The cross coupling of transistors 809 and 810 provide negative resistance and make the combined resistance seen on the drains of transistors 801 and 802 high and thus make a high gain. Transistors 803, 804, 809 and 810 form a load comparable to load 728 of comparator stage 704 of FIG. 7. A switch 826 selectively grounds the sources of the transistors 801 and 802 of the differential input pair in response to an enable signal 830 (e.g., the comparator enable signal 410 of FIG. 4) to increase the VGS on the input transistors to the comparator to thereby increase the differential current in the differential pair.

A switch to ground is used on the main comparator for dynamic biasing instead of a constant current bias source to increase the VGS on the input transistors to the main comparator to thereby increase the differential current in the differential pair.

Figure 9:
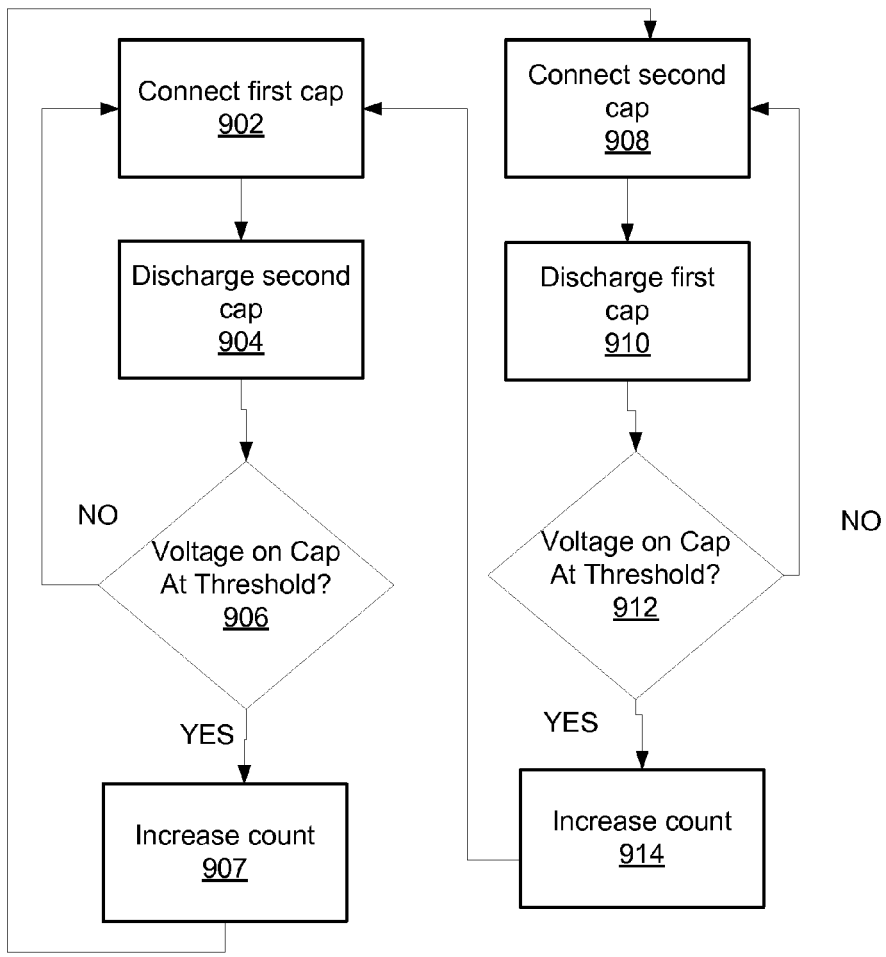
FIG. 9 illustrates a simplified diagram illustrating a process flow for current counting according to an embodiment.

FIG. 9 illustrates a simplified diagram illustrating a process flow 900 for current counting according to an embodiment. At 902, a first capacitor (e.g., capacitor 304-1) is coupled to the current source and the comparator. At 904, a second capacitor (e.g., 304-2) is discharged. If, at 906, the voltage on the first capacitor has not reached the threshold (e.g., Vref), the process loops back to 902. Otherwise, at 907, the count of the comparator triggers is increased by one, and the process loops to 908, the second capacitor (e.g., capacitor 304-2) is coupled to the current source and the comparator. At 910, the first capacitor (e.g., 304-1) is discharged. If, at 912, the voltage on the second capacitor has not reached the threshold (e.g., Vref), the process loops back to 908. Otherwise, at 914, the count of the comparator triggers is increased by one, and the process loops to 902.

The switches described herein can be implemented as one or more transistors.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
    a regulator comprising a pass transistor and a replica transistor, wherein the replica transistor generates a sense current;
    a first capacitor configured to receive the sense current in a first mode;
    a second capacitor configured to receive the sense current in a second mode, wherein when the first capacitor receives the sense current, the second capacitor does not receive the sense current, and when the second capacitor receives the sense current, the first capacitor does not receive the sense current;
    a comparator coupled to the first capacitor to compare a voltage of the first capacitor to a reference voltage and generate a count signal in response to the voltage of the first capacitor reaching the reference voltage in the first mode and coupled to the second capacitor to compare a voltage of the second capacitor to the reference voltage and generate the count signal in response to the voltage of the second capacitor reaching the reference voltage in the second mode;
    a reset circuit to discharge the first capacitor in the second mode and to discharge the second capacitor in the first mode in response to the count signal; and
    a counter incrementing a count of a number of occurrences of the count signal.

2. The circuit of claim 1 further comprising a switch circuit to couple the first capacitor to the comparator in the first mode and couple the second capacitor to the comparator in the second mode.

3. The circuit of claim 1 wherein the reset circuit comprises a first switch coupled in parallel to the first capacitor and a second switch coupled in parallel to the second capacitor.

4. The circuit of claim 1 wherein the comparator comprises:
    a main comparator having an input coupled to the first capacitor and to the second capacitor, the main comparator comparing the voltage on the input to the reference voltage and generating the count signal in response to the voltage on the input reaching the reference voltage; and
    an auxiliary comparator that enables the main comparator when the input to the main comparator is within a threshold of the reference voltage.

5. The circuit of claim 1 wherein the comparator comprises:
    a main comparator having an input coupled to the first capacitor and to the second capacitor, the main comparator comparing the voltage on the input to the reference voltage and generating the count signal in response to the voltage on the input reaching the reference voltage; and
    an auxiliary comparator including an input coupled to the first capacitor and to the second capacitor and including an output to provide an enable signal to the main comparator in response to a comparison of the voltage on the input to a trigger voltage that is less than the reference voltage.

6. The circuit of claim 1 wherein the comparator comprises:
    a main comparator having an input coupled to the first capacitor and to the second capacitor, the main comparator comparing the voltage on the input to the reference voltage and generating the count signal in response to the voltage on the input reaching the reference voltage, the main comparator includes a differential input pair and a switch to selectively ground the differential input pair; and
    an auxiliary comparator that enables the switch of the main comparator in response to the input to the main comparator being within a threshold of the reference voltage.

7. The circuit of claim 6 wherein the main comparator comprises one or more preamplifiers to increase DC bias of the differential input pair of the main comparator or to amplify the input signal.

8. The circuit of claim 6 wherein the auxiliary comparator comprises a differential input.

9. A circuit comprising:
- a regulator comprising a pass transistor and a current source, the current source comprising a replica transistor having a control terminal coupled to a control terminal of the pass transistor;
- first means for integrating charge received from the current source in a first mode;
- second means for integrating charge received from the current source in a second mode, wherein when the first means for integrating receives charge, the second means for integrating does not receive charge from the current source, and when the second means for integrating receives charge, the first means for integrating does not receive charge from the current source;
- means for comparing a voltage of the first means for integrating charge to a reference voltage and generating a count signal in response to the voltage of the first means for integrating charge reaching the reference voltage in the first mode and for comparing a voltage of the second means for integrating charge to the reference voltage and generating the count signal in response to the voltage of the second means for integrating charge reaching the reference voltage in the second mode;
- means for counting a number of occurrences of the count signal;
- first means for discharging the first means for integrating charge in response to the count signal in the second mode; and
- second means for discharging the second means for integrating charge in response to the count signal in the first mode.

10. The circuit of claim 9 wherein the means for comparing comprises:
- main means for comparing a voltage on an input thereof that is coupled to the first means for integrating charge and to the second means for integrating charge to the reference voltage and generating the count signal in response to the voltage on the input reaching the reference voltage; and
- auxiliary means for comparing the input to the main means to the reference voltage, and if the comparison is within a threshold of the reference voltage, enabling the main means for comparing.

11. The circuit of claim 9 wherein the means for comparing comprises:
- main means for comparing a voltage on an input thereof that is coupled to the first means for integrating charge and to the second means for integrating charge to the reference voltage and generating the count signal in response to the voltage on the input reaching the reference voltage; and
- auxiliary means for comparing including a differential input pair that triggers at a voltage below the reference voltage to enable the main means for comparing.

12. The circuit of claim 9 wherein the means for comparing comprises:
- main means for comparing a voltage on an input thereof that is coupled to the first means for integrating charge and to the second means for integrating charge to the reference voltage and generating the count signal in response to the voltage on the input reaching the reference voltage, the main means for comparing includes a differential input pair and a switch to selectively ground the differential input pair; and
- auxiliary means for comparing the input to the main means to the reference voltage, and if the comparison is within a threshold of the reference voltage, enabling the switch of the main means for comparing.

13. The circuit of claim 12 wherein the main means for comparing comprises means for increasing DC bias of the differential input pair of the main means for comparing.

14. The circuit of claim 12 wherein the auxiliary means for comparing comprises a differential input pair.

15. A method comprising:
- generating a sense current in a current source of a regulator, the regulator comprising a pass transistor and a replica transistor, wherein the current source comprises the replica transistor and wherein the replica transistor comprises a control terminal coupled to a control terminal of the pass transistor;
- storing charge received from the current source in a first capacitor in a first mode;
- storing charge received from the current source in a second capacitor in a second mode, wherein when the first capacitor receives charge, the second capacitor does not receive charge from the current source, and when the second capacitor receives charge, the first capacitor does not receive charge from the current source;
- discharging the first capacitor in the second mode;
- discharging the second capacitor in the first mode;
- comparing a voltage of the first capacitor to a reference voltage and generating a count signal in response to the voltage of the first capacitor reaching the reference voltage in the first mode;
- comparing a voltage of the second capacitor to the reference voltage and generating the count signal in response to the voltage of the second capacitor reaching the reference voltage in the second mode;
- counting a number of occurrences of the count signal; and
- switching between the first and second modes in response to the count signal.

* * * * *